United States Patent
Conley, Jr. et al.

(10) Patent No.: US 7,442,415 B2
(45) Date of Patent: *Oct. 28, 2008

(54) MODULATED TEMPERATURE METHOD OF ATOMIC LAYER DEPOSITION (ALD) OF HIGH DIELECTRIC CONSTANT FILMS

(75) Inventors: John F. Conley, Jr., Camas, WA (US); Yoshi Ono, Camas, WA (US); Gregory M. Stecker, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 538 days.

This patent is subject to a terminal disclaimer.

(21) Appl. No.: 10/412,550

(22) Filed: Apr. 11, 2003

(65) Prior Publication Data

US 2004/0203254 A1    Oct. 14, 2004

(51) Int. Cl.
*C23C 16/00* (2006.01)

(52) U.S. Cl. .............. 427/255.36; 427/248.1; 427/255.28

(58) Field of Classification Search .......... 427/248.1, 427/255.28, 255.36, 255.29

See application file for complete search history.

(56) References Cited

U.S. PATENT DOCUMENTS

| | | | |
|---|---|---|---|
| 6,203,613 B1 * | 3/2001 | Gates et al. | 117/104 |
| 6,420,279 B1 * | 7/2002 | Ono et al. | 438/785 |
| 6,686,212 B1 * | 2/2004 | Conley et al. | 438/3 |
| 6,846,743 B2 * | 1/2005 | Endo et al. | 438/681 |
| 6,875,677 B1 * | 4/2005 | Conley et al. | 438/585 |
| 6,930,059 B2 * | 8/2005 | Conley et al. | 438/785 |
| 6,984,592 B2 * | 1/2006 | Vaartstra | 438/785 |
| 2003/0003635 A1 * | 1/2003 | Paranjpe et al. | 438/149 |
| 2003/0134038 A1 * | 7/2003 | Paranjpe | 427/248.1 |
| 2005/0112874 A1 * | 5/2005 | Skarp et al. | 438/680 |

* cited by examiner

*Primary Examiner*—Brian K Talbot
(74) *Attorney, Agent, or Firm*—David C Ripma

(57) ABSTRACT

A method of forming a layer of high-k dielectric material in an integrated circuit includes preparing a silicon substrate; forming a high-k dielectric layer by a sequence of ALD cycles including: depositing a first layer of metal ligand using ALD with an oxygen-containing first precursor; and depositing a second layer of metal ligand using ALD with a second precursor; repeating the sequence of ALD cycles N times until a near-critical thickness of metal oxide is formed; annealing the substrate and metal oxide layers every N ALD cycles in an elevated temperature anneal; repeating the sequence of ALD cycles and elevated temperature anneals until a high-k dielectric layer of desired thickness is formed; annealing the substrate and the metal oxide layers in a final annealing step; and completing the integrated circuit.

10 Claims, 5 Drawing Sheets

MODULATED TEMPERATURE METHOD OF ATOMIC LAYER DEPOSITION (ALD) OF HIGH DIELECTRIC CONSTANT FILMS

RELATED APPLICATIONS

This application is related to application Ser. No. 09/894,941, filed Jun. 28, 2001, for Methods of using atomic layer deposition to deposit a high dielectric constant material on a substrate, now U.S. Pat. No. 6,420,279 B1, granted Jul. 16, 2002; application Ser. No. 10/286,100, filed Oct. 31, 2002, for Method to deposit a stacked high k gate dielectric for CMOS applications now U.S. Pat. No. 6,686,212 B1, granted Feb. 3, 2004, application Ser. No. 10/376,774, filed Feb. 27, 2003, for Two precursor method to perform atomic layer deposition (ALD) of a stacked high-k gate dielectric for CMOS applications now abandoned, and application Ser. No. 10/376,794, filed Feb. 27, 2003, for Method for depositing a nanolaminate film by atomic layer deposition, now U.S. Pat. No. 6,930,059 B1, granted Aug. 16, 2005.

FIELD OF THE INVENTION

This invention relates to a method for deposition of uniform ceramic films for a wide range of applications, such as optical coatings, passivation coatings for metallurgical and biomedical applications, and for integrated circuit fabrication, and specifically for forming a MOS gate dielectric separating a transistor gate from a channel between a source and a drain using a dual-precursor deposition and annealing process.

BACKGROUND OF THE INVENTION

Dielectric materials in semiconductor devices in integrated circuits appear as gate dielectrics in dynamic random access memory (DRAM), field effect transistors (FET) and capacitor dielectrics. The dimensions of these dielectrics are related directly to the performance of the semiconductor devices. To achieve faster responses and more complex functionality, integrated circuits are made more compact, e.g., smaller in lateral size and thickness.

The performance of a dynamic random access memory (DRAM) device is related to the charge stored in its capacitor, which change is directly proportional to the area and dielectric constant k of the capacitor, and inversely proportional to the thickness of the capacitor. As the capacitor size decrease, a high-k dielectric is needed in the capacitor to maintain an adequate capacitance charge in a high performance DRAM device.

The operating speed of a semiconductor device is directly proportional to the response of a gate dielectric in a field effect transistor (FET) after a voltage is applied. The response of a gate dielectric is directly proportional to the dielectric constant k and inversely proportional to the dielectric material thickness. Thus, the need for a thin and high-k dielectric is also highly desirable for a gate dielectric.

Silicon dioxide ($SiO_2$) is the conventional material used for gate dielectrics, having a dielectric constant of about 4. As device dimensions are scaled down, the thickness of the silicon dioxide gate dielectric reaches its tunneling limit of between about 1.5 nm to 2 nm. Silicon dioxide films of less than 1.5 nm have a high leakage from direct tunneling currents and generally cannot be used as a gate dielectric in FET devices because of excessive power consumption. Other fabrication and reliability concerns of very thin silicon dioxide films include boron penetration and charge injection damage.

For MOS technology, thermally grown $SiO_2$ on silicon provides the dominant gate structure. The $Si/SiO_2$ interface has excellent properties, including low interface and bulk trapping, thermal stability, high breakdown, etc. With each successive generation of microelectronics technology, however, the thickness of the $SiO_2$ is scaled down. As the gate oxide thickness is scaled below 1.5 nm, problems arise, such as excessive power consumption due to current leakage from direct tunneling, boron dopant penetration, reliability concerns, etc. Because of these problems, $SiO_2$ will likely be replaced by a higher dielectric constant (k) material. A higher k material which will allow the use of a greater thickness to achieve the same capacitance. Requirements for this high-k material include lower leakage, low interface traps, low trapped charge, good reliability, good thermal stability, conformal deposition, etc.

So far, a suitable replacement for $SiO_2$ has not been found. The most promising candidate materials are metal oxides, such as $HfO_2$ and $Hf_xAl_yO_z$. Because of the requirements for conformality and thickness control, atomic layer deposition (ALD) has emerged as one of the most promising deposition techniques. In this technique, dielectric material is built up layer-by-layer in a self-limiting fashion, i.e., the deposition phenomenon where only one monolayer of a chemical species will adsorb onto a given surface.

In ALD, the precursor vapors are injected into the process chamber in alternating sequences: precursor, purge gas, reactant, purge gas. The precursor adsorbs onto the substrate and subsequently reacts with the reactant. There are various modifications of the ALD processes, however, basic ALD processes all contain two distinct properties: alternating injection of precursors and the saturation of the precursor adsorption. By alternating precursors and reactants in the vapor stream, separated by a purge gas, the possibility of gas phase reaction is minimized, allowing a wide range of possible precursors. Also, because of the self-limiting nature of the chemisorption mechanism, the deposited film is extremely uniform, because once the surface is saturated, the additional precursors and reactants will not further adsorb or react and will be exhausted away.

The precursor requirements of ALD are different from those of CVD because of the different deposition mechanisms. ALD precursors must exhibit a temperature range between condensation and decomposition and have a self-limiting effect, so that only a monolayer of precursor is adsorbed on the substrate. Precursors designed for ALD use must readily adsorb at bonding sites on the deposited surface in a self-limiting mode. Once adsorbed, the precursors must react with the reactants to form the desired film. In CVD, the precursors and the reactants arrive at the substrate together and the film is deposited continuously from the reaction of the precursors with the reactants. The deposition rate in CVD process is proportional to the precursor and reactant flow rate and to the substrate temperature. In CVD, the precursor and the reactant must react at the deposited surface simultaneously to form the desired film. Thus many useful CVD precursors are not viable as ALD precursors and vice versa. It is not trivial or obvious to select a precursor for the ALD method.

Currently, the leading ALD precursors for depositing metal oxides are metal organics, metal halides, metal amides, and anhydrous metal nitrates. These precursors all have serious drawbacks. Metal organics have the potential to introduce organic contamination into the IC structure during the fabrication process, leading to degraded IC performance.

$HfO_2$ and $ZrO_2$ films deposited using a metal halide precursor, such as $[M^+]Cl_4$, demonstrate good insulating properties, including high dielectric constant and low leakage, however, they do not provide smooth deposition directly on H-terminated silicon and require several "incubation" cycles, which may result in roughening. For uniform initiation, they require several monolayers of $SiO_2$ or $Si_3N_4$. Because even a very thin low-k layer can negate most of the benefits of an overlying high-k layer, the presence of several monolayers of $SiO_2$ makes it difficult to achieve EOT<1.0 nm using this type of precursor. Deposition directly on hydrogen-terminated silicon is essential. This initiation problem must be solved before metal-chloride precursors can be used in production.

The nitrate ($NO_3$) ligand is a powerful oxidizing and nitriding agent, and capable of reacting strongly with many compounds. Gates et al., U.S. Pat. No. 6,203,613, granted Mar. 20, 2001, for Atomic layer deposition with nitrate containing precursors, describes an ALD method using metal nitrate precursors in conjunction with oxidizing, nitriding and reducing co-reactants to deposit oxide, nitride and metal films, respectively.

Ono et al., in U.S. Pat. No. 6,420,279, granted Jul. 16, 2002, for Method of using atomic layer deposition to deposit a high dielectric constant material on a substrate, for example, describes ALD deposition of zirconium oxide using zirconium nitrate precursor, together with an oxidizing agent, such as water or methanol; and the ALD deposition of hafnium oxide using a hafnium nitrate precursor together with an oxidizing agent, such as water or methanol, which patent is incorporated herein by reference.

A metal nitrate precursor, $Hf(NO_3)_4$ has recently been demonstrated as a viable ALD precursor, in the first-above-identified related Application and in Conley et al., Atomic layer deposition of hafnium oxide using anhydrous hafnium nitrate, Electrochemical and Solid-State Letters, 5 (5), C57-59 (2002). The primary benefit of $Hf(NO_3)_4$ is that it allows deposition initiation directly on H-terminated silicon, resulting in a uniform thin layer, without the requirement of an initial layer of low-k material. However, as previously noted, $HfO_2$ films deposited via ALD of $Hf(NO_3)_4$ have a dielectric constant that is lower than expected, possibly due to the low density of the films (~8.5 $g/cm^3$ vs. a bulk value of 9.7 $g/cm^3$), even after a post deposition anneal of up to 850° C. The low film density may be a result of the low deposition temperature (~170° C.) required for use of this precursor. Before metal-nitrate precursors can find widespread use, the "bulk" dielectric properties of the resulting films must be improved.

In addition, films produced by all of the above-described methods suffer from poor channel mobility when integrated into an MOS device structure.

Yet another problem with traditional method of ALD is the presence of silicon oxide at the wafer interface. This layer forms because, in addition to the requirement for a metal precursor, an oxidizing precursor is also required, which promotes formation of silicon oxide. The oxidizing precursor produces an unwanted $SiO_2$ layer between the wafer surface and the metal oxide film.

The use of water vapor introduces a number of problems: The introduction of the necessary quantity of water vapor is difficult to control, and typically, an abundance of water vapor is introduced into the chamber. Water is a polar molecule, and adsorbs efficiently onto surfaces, i.e., the chamber walls. Desorption of water vapor, e.g., via vacuum pumping, adds considerable time to the overall process time, reducing the throughput.

The second through fourth above-identified related patents and patent applications describe methods to improve the quality of the ALD metal-oxide films in which a combination of precursors is used. The use of a combination of precursors provides the advantages of each precursor while minimizing the disadvantages. The "dual-precursor" methods described in the related applications allows for more efficient ALD of $HfO_2$, while negating the need for a separate oxidizing source, such as $H_2O$. However, although the films received a post deposition densification anneal, it was found that the density was still only ~8.5 $g/cm^3$, much lower than the reported bulk value.

SUMMARY OF THE INVENTION

A method of forming a layer of high-k dielectric material in an integrated circuit includes preparing a silicon substrate; forming a high-k dielectric layer by a sequence of ALD cycles including: depositing a first layer of metal ligand using ALD with an oxygen-containing first precursor; and depositing a second layer of metal ligand using ALD with a second precursor; repeating the sequence of ALD cycles N times until a near-critical thickness of metal oxide is formed; annealing the substrate and metal oxide layers every N ALD cycles in an elevated temperature anneal; repeating the sequence of ALD cycles and elevated temperature anneals until a high-k dielectric layer of desired thickness is formed; annealing the substrate and the metal oxide layers in a final annealing step; and completing the integrated circuit.

It is an object of the invention to provide a very uniform deposition of dense metal oxide films at low temperatures.

Another object of the invention is to provide a method of efficiently removing excess ligands before the ligand buildup is so great that the ligands cannot all be removed by a post deposition anneal.

Another object of the invention to provide a very uniform deposition of dense metal oxide films without use of an oxidizing species, such as oxygen or water.

It is a further object of the invention to provide a very uniform deposition of dense hafnia films at low temperature without use of an oxidizing species such as oxygen or water.

Another object of the invention is to provide a hafnia on a H-terminated silicon surface.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The method of the invention provides a modified method of the invention of the above-identified related methods of the inventions, using a "no-$H_2O$" technique. An anneal is performed after every N deposition cycles, where N is an integer greater than or equal to one. This method results in films of increased density and improved dielectric quality.

The present state of the art for gate formation involves oxidation of silicon at high temperatures. It is likely, however, that in the near future, $SiO_2$ will be replaced by a metal-oxide such as $HfO_2$, $ZrO_2$, etc. Although a high-k deposition method has not been established yet, a leading technique is atomic layer chemical vapor deposition (ALD or ALCVD).

ALD is typically performed using a single precursor such as a metal halide, a metal amide, a metal organic, or an anhydrous metal nitrate. As described above, these precursors all have disadvantages.

In a related application, two precursors, $Hf(NO_3)_4$ and $HfCl_4$, were alternated to achieve high deposition rate ALD of a $HfO_2$ directly on H-terminated silicon. It wags demonstrated that $Hf(NO_3)_4$ could be used as an oxidizing agent for $HfCl_4$, eliminating the need for $H_2O$ and other oxidizing agents. Although the films received a post deposition densification anneal, it was found that the density was still only ~8.5 $g/cm^3$, much lower than the reported bulk value.

When $Hf(NO_3)_4$ is used as a precursor to deposit films via CVD, higher temperatures are used and higher densities are achieved. The increased density may be linked with improved dielectric properties because, for a given material, a higher density results in a higher refractive index and a higher dielectric constant. Although a post deposition anneal results in film densification, even when performed at high temperatures, bulk density is still not achieved.

The "modulated temperature" method of the invention described herein includes ALD of dense $HfO_2$ films of improved dielectric quality. Previously, ALD films received an in-situ or ex-situ post deposition densification anneal after film deposition, i.e., after all of the ALD cycles are completed. In the present invention, the film is annealed in-situ, after one or more ALD deposition cycles. The advantage of performing the anneal step after N cycles is to efficiently remove excess ligands before the ligand buildup is so great that they cannot all be removed by the post deposition anneal. The invention includes a method of gate oxide deposition using atomic layer deposition (ALD).

Figure 1:
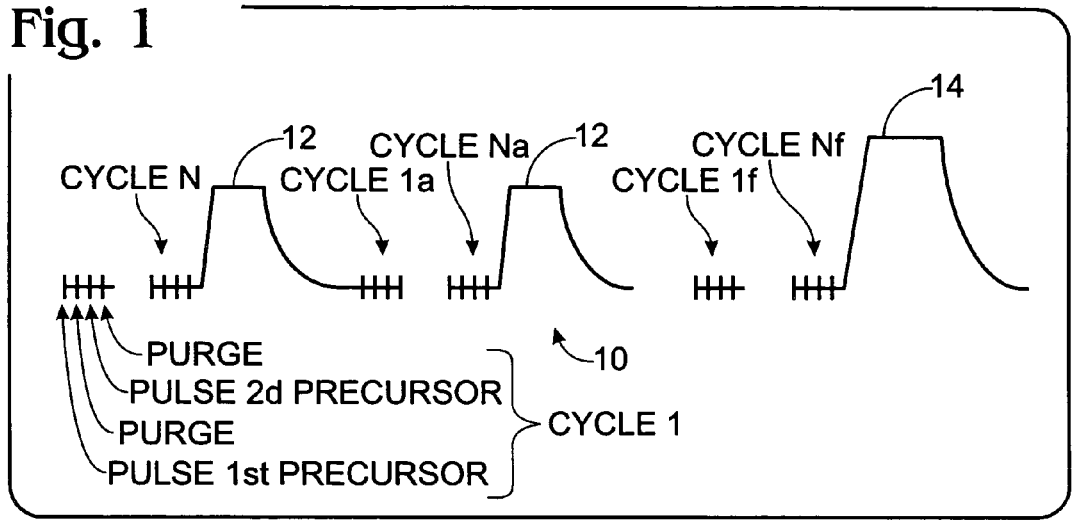
FIG. 1 is a graphical representation of the steps of the method of the invention.

The use of "modulated temperature" ALD, in which in-situ anneals are performed after each N deposition cycle, is demonstrated to provide a better thin film than in the above-identified related applications. Each anneal allows easier ligand removal from the just-deposited layer and results in densification and a concomitant increase in dielectric constant of the resulting films. In the related cases, films were deposited using the "dual-precursor" technique, e.g., $Hf(NO_3)_4$ and $HfCl_4$ precursors were used. $Hf(NO_3)_4$ allows deposition directly on H-terminated silicon and serves as an oxidizing agent for $HfCl_4$. $H_2O$ does not need to be used. The modulated temperature profile of the method of the invention is depicted in FIG. 1, generally at 10, where temperature is the y-axis and time is the x-axis. The method of the invention includes, in the preferred embodiment, a pulse of an oxygen-containing first precursor, e.g., $Hf(NO_3)_4$; followed by a purge, e.g. with nitrogen gas, a pulse of a second precursor, e.g., $HfCl_4$; followed by another purge, e.g., nitrogen, which comprises an ALD cycle. The ALD cycles are repeated until the metal oxide layer nears a critical thickness, at N cycles, at which point, an elevated temperature anneal 12 is performed. The ALD cycle and periodic elevated temperature anneal are repeated to produce a film of desired thickness. In order to immediately initiate deposition directly on hydrogen terminated silicon, the $Hf(NO_3)_4$ pulse must start the sequence. FIG. 1 depicts the method of the invention wherein alternating ALD deposition cycles and annealing cycles are performed to fabricate a $HfO_2$ thin film. A second ALD cycle, cycle N, includes the same precursor pulses and purges as does cycle 1. ALD cycles 1a to Na are performed until a second critical thickness is reached. ALD cycles and periodic elevated temperature anneals are repeated until ALD cycle Nf, when an oxide layer having a desired thickness is acquired, and a final anneal 14 at a higher temperature is performed. The second precursor may be a non-oxygen-containing precursor, such as $HfCl_4$, or, the second precursor may be an oxygen containing precursor, and may be simply $H_2O$.

The structure prior to depositing the gate oxide is formed by any state of the art method, referred to herein as preparing the substrate. The example shown in the figures is for a replacement gate process. The last step prior to forming the gate oxide is to expose the silicon surface to HF to prepare a H-terminated silicon surface.

Figure 2:
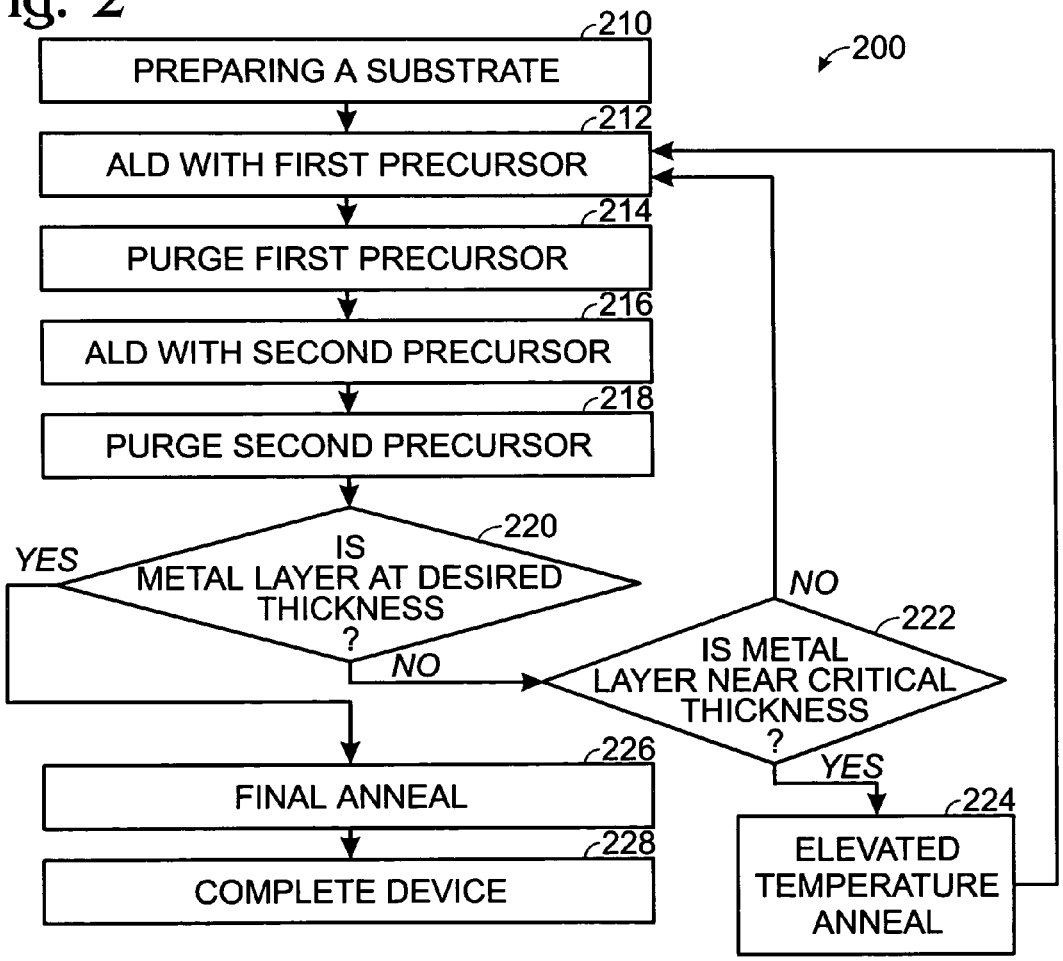
FIG. 2 is a block diagram of the steps of the method of the invention.

FIG. 2 is a flowchart depicting the steps of the method of the invention of depositing an oxide nanolaminate thin film using a nitrate-containing first precursor as an oxidizing agent for the second precursor and annealing the substrate and the thin film after every N ALD cycles. The formation of a $HfO_2$ metal oxide layer is used as an example, however, the method of the invention will work with other metal oxides, as described later herein. Preparing the substrate, step 210, means that the semiconductor substrate has undergone all circuit fabrication processes up to the need for a high-k dielectric film. In the case of a high-k capacitor dielectric, the substrate is prepared to have the bottom electrode ready. In the case of a high-k gate dielectric, the substrate is ready to receive the gate dielectric. The preparation may include the formation of device isolation structure and a gate patterning step if a metal gate process is used. Then the semiconductor substrate is prepared to have a hydrogen-terminated silicon surface. A hydrogen-terminated silicon surface is a result of many standard industry semiconductor cleaning processes. These standard cleaning processes are typically a quick immersion of the silicon wafers into an HF solution to remove any native oxide of the silicon surface and to produce a silicon surface that is hydrogen terminated. The hydrogen-terminated silicon surface is essential to remove all trace amount of native silicon oxide that could lower the effective k value of the high-k dielectric. Experiments have shown that a combination of hafnium nitrate precursor and a hydrogen-terminated silicon surface can result in the initiation of the deposition of hafnium oxide directly on the hydrogen-terminated silicon surface without the need for an incubation period or the need for a thin silicon dioxide interfacial layer. Conley et al., supra.

Step 210 provides a substrate within a process chamber. The substrate has undergone appropriate preparation, as described above, prior to starting the deposition, including a HF bath to provide a H-terminated silicon surface. The deposition normally occurs at low pressure, typically at 1 Torr pressure, so the chamber needs to be pumped down to the base pressure, in about the milliTorr range, to reduce possible contamination. The substrate temperature needs to be prepared for the adsorption of the first precursor. Typical temperature for optimum adsorption is between 150 to 190° C., with 170° C. being a preferred temperature, however, to prevent deposition on the chamber wall, the chamber wall setting is much lower than the substrate temperature. To prevent condensation of the precursor, the chamber wall also needs to be at about the same temperature as the precursor vapor, typically between 50° C. and 100° C. An appropriate temperature for the hafnium nitrate precursor is about 88° C. There are no other special settings for the chamber. Because this process uses atomic layer deposition technique, meaning a sequence of precursor pulses, the chamber volume is desirably small to accelerate the saturation of precursor in the chamber volume, and the quick purging of the precursor.

The deposition technique uses the chemical vapor of the precursors delivered sequentially into the process chamber, therefore the precursors need to be maintained at appropriate temperature to provide an adequate vapor pressure in the process chamber. For gaseous precursors, i.e., precursors that are in the gaseous state at room temperature, room temperature is adequate. For liquid precursors, i.e., precursors which are liquid at room temperature, the precursor temperature setting depends on the equilibrium vapor pressure of the liquid precursors. High volatile liquid precursors, such as alcohol and acetone, have a high equilibrium vapor pressure, so a low temperature setting at about room temperature is adequate to maintain a good vapor pressure. For low volatile liquid precursors or solid precursors, a high temperature setting is needed. The higher the precursor temperature, the higher the precursor vapor pressure, which provides for an easier precursor delivery, so long as the temperature is set lower than a maximum precursor temperature, whereat the precursors may be damaged, such as by thermal decomposition.

After the preparation of the process chamber and the substrate, the next step, 212, is the introduction of the oxygen-containing first precursor, in the preferred embodiment, a first metal nitrate-containing precursor, such as $Hf(NO_3)_4$. This precursor contains a number of nitrate ligands ($NO_3$) bonding with the first metal (Hf) which provide a source of oxygen. Depending on the valency of the first metal, the number of nitrate ligands can vary from 1 nitrate ligand to the maximum number of ligands to fill the valency of the metal. For example, the valency of hafnium is 4. Therefore, the hafnium nitrate-containing precursor can contain from 1 to 4 nitrate ligands. The basic concept of the method of the invention is the use of nitrate ligands which act as oxidizers, therefore only one nitrate ligand is essential. The actual number of nitrate ligands in the precursor may be used as a control factor to optimize the amount of oxygen incorporated in the nanolaminate thin film.

After an appropriate time, which generally requires between about 0.1 seconds to 100 seconds, to allow the complete adsorption of the first metal nitrate-containing precursor onto the substrate, the precursor is purged from the process chamber, step 214. The adsorption characteristic is self-limiting, therefore the precursor cannot adsorb more than one monolayer on the substrate surface, with typically only a sub-monolayer being adsorbed. In a chamber using a showerhead delivery, the travel distance of the precursor is short and fairly uniform for all areas of the substrate, so the process of complete adsorption time of the precursor onto the substrate is short. In contrast, if the precursor is designed to deliver from one end and exhaust from the other end of the process chamber, the precursor depletion effect can lengthen the adsorption time. Similarly, a small chamber volume can offer shorter adsorption time because of faster chamber saturation. The substrate topology can also affect the adsorption time. In structures having deep trenches, precursor depletion effect and precursor delivery effect can lengthen the adsorption time.

The purging may be accomplished by a pumping step or a replacement step to remove the first precursor from the process chamber. The pumping step includes a reduction in chamber pressure to evacuate all gases. The replacement step includes use of non-reacting gas, such as nitrogen or an inert gas, to push the remaining first precursor out of the process chamber. A characteristic of the replacement step is that the chamber pressure is maintained during the purge, with the precursor turned off and the purge gas turned on. A combination of these two steps may be used in the purging step, e.g., a pumping step followed by a gas replacement step.

A longer purge time provides for more complete removal of the precursor, resulting, however, in a drop in throughput. Economic reasons dictate that the shortest purging time be used, therefore the optimum purging time is such that the presence of precursor residue does not affect the overall process. Complete removal of the precursor is not required.

After the chamber is free from the first precursor, the second precursor, such as $HfCl_4$, is introduced into the process chamber in step 216. The adsorbed materials, either the first metal oxide or the nitrate ligands from the first precursor or both, will react with the second metal in the second precursor to form both first metal oxide and second metal oxide in a two-oxide nanolaminate thin film structure. The known prior art process of oxide nanolaminate thin film requires an oxidizer, such as water, oxygen, alcohol, or ozone, to form the metal oxides, and therefore requires eight separate pulses of precursor/purge/oxidizer/purge/precursor/purge/oxidizer/ purge, instead of only four pulses as in the oxidizer-capable precursor/purge/precursor/purge method of the invention.

After the nanolaminate formation, the second precursor is purged from the process chamber in step 218. Again, the purging step may be a pumping step, or a replacement step, or a combination of both a pumping and a replacement steps.

Step 220 asks whether the metal layer is a the desired (final) thickness. If "No," step 222 asks whether the metal layer is near the critical thickness, e.g., that thickness where excess ligands may be efficiently removed before their buildup is so great that they can not be all removed by the post deposition (final) anneal. If the metal layer is not near the critical thickness, steps 212 to 218 are repeated, until the critical thickness is reached, at which point an in-situ, elevated temperature anneal, step 224, is performed. The elevated temperature anneal takes place at a temperature of between about 300° C. to 850° C. for between about one second to five minutes. The purpose of this step is to drive off any residual ligands left over from the precursor and to density the film. The advantage of performing this step after N ALD cycles is to remove the excess ligands from the just-deposited layer before the ligand buildup is too great for removal to occur in a single, post deposition annealing step.

Steps 212, 214, 216, 218, and periodic elevated temperature anneal step 224, may be repeated until a desired metal oxide layer thickness is reached, "yes" to step 220, The resulting nanolaminate thin film can then be annealed, the final anneal, at higher temperature, such as between 400° C. to 1000° C., for between about one second to ten minutes, to improve the film quality, step 226. After the final annealing step, device completion takes place, step 228, following state-of-the-art processes.

Figure 3:
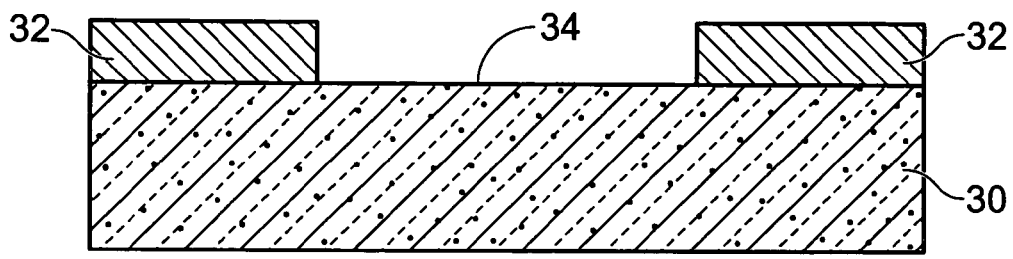
FIGS. 3 to 7 depict successive configurations of a device constructed according to the method of the invention.

The structure prior to depositing the gate oxide is formed by any state of the art method. The example shown in FIGS. 3-7 is for a replacement gate process. Referring to FIG. 3, a substrate 30 has filled oxide regions 32 formed thereon. The last step prior to forming the gate oxide is to expose the silicon surface to HF to prepare a H-terminated silicon surface 34.

Figure 4:
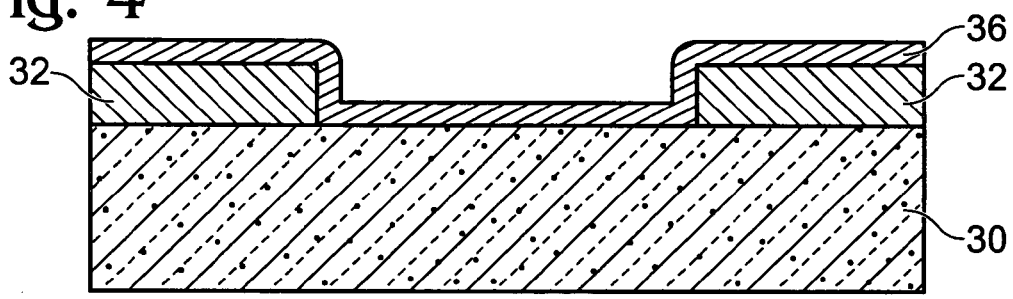

FIG. 4 depicts the results of the first ALD cycle, using a pulse of Hf(NO$_3$)$_4$ precursor, step 212. The purpose of this pulse is to initiate deposition of an HfO$_2$ layer 36 directly on H-terminated silicon surface 34, without the need for an "incubation" period or a thin SiO$_2$ layer.

Figure 5:
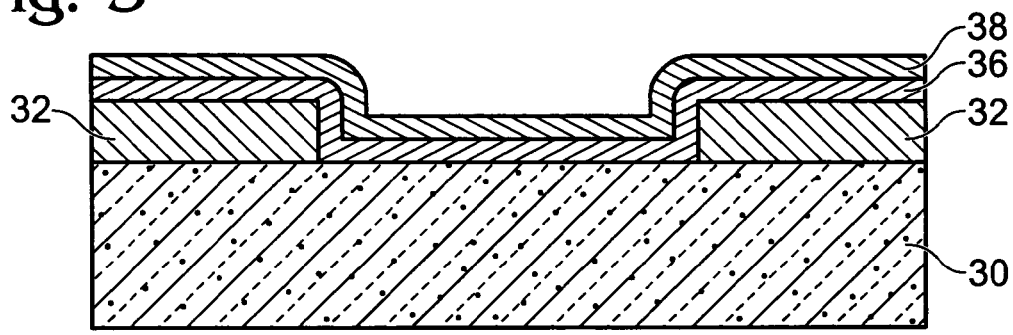
Figure 6:
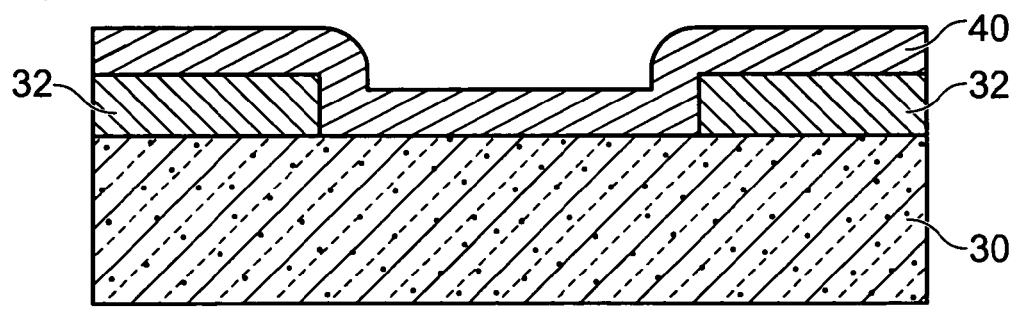

The Hf(NO$_3$)$_4$ pulse is followed by a nitrogen purge, step 214, and then pulse of HfCl$_4$ precursor, step 216. The purpose of the HfCl$_4$ pulse is to complete a monolayer deposition or ALD cycle of HfO$_2$ layer 38, as shown in FIG. 5. This is followed by the second purge step 218.

After N ALD cycles, multiple oxide layers are present on the substrate as the critical thickness is reached. An in-situ elevated temperature anneal, step 224, is performed. The purpose of this step is to drive off any residual ligands left over from the precursor and to densify the film, forming a unified, densified dielectric layer 40, which is comprised of multiple layers 36 and 38. The advantage of performing this step after every N ALD cycles is to remove the excess ligands from the just deposited layer before the buildup is too great for removal to occur during a post deposition anneal process.

Figure 7:
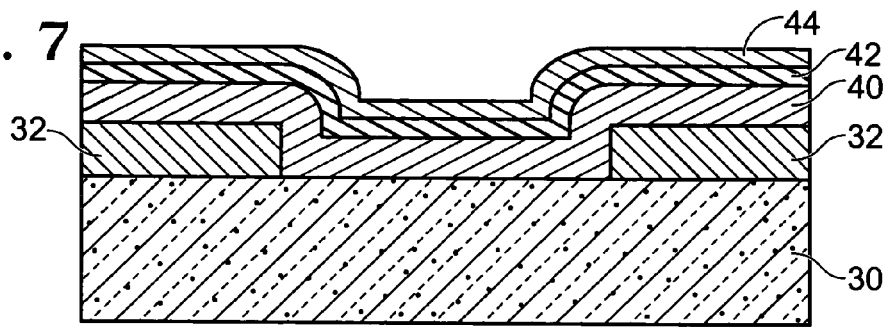

The sequence is repeated until the film reaches the desired, final thickness, by depositing additional unified and densified dielectric layers, such as 42, 44, as shown in FIG. 7, and periodic elevated temperature anneals. The fabrication process then proceeds with deposition of the gate material, such as a metal gate followed by CMP. The remaining steps are conventional fabrication processes. The process described eliminates the need for an initial low-k interfacial layer while still achieving a film with a high dielectric constant. The factors which determine the critical thickness include, but are not limited to, the metal oxide being deposited, chamber, substrate and precursor temperature, chamber pressure, deposition time and annealing temperature and time. It will be appreciated by those of ordinary skill in the art that N ALD cycles may be a single ALD cycle, or may be many ALD cycles, depending on the deposition conditions, the metal oxide being deposited, and the nature of the first and second precursors.

The deposition of the first and second layers of metal ligand results in a film having a thickness of between less than a monolayer to about 2.5 nm.

EXAMPLE

An example of demonstrated utility of the method of the invention follows: HfO$_2$ films were deposited on H-terminated silicon using 10, 15, and 45 cycles of Hf(NO$_3$)$_4$/HfCl$_4$/ and periodic elevated temperature anneal, as described above. The resulting films were visually uniform. In this example, the films were annealed after every ALD cycle, e.g., N=1. Control films were also deposited in which the films were annealed only after the deposition was complete.

High Deposition Rate, Directly on H-terminated Silicon

Figure 8:
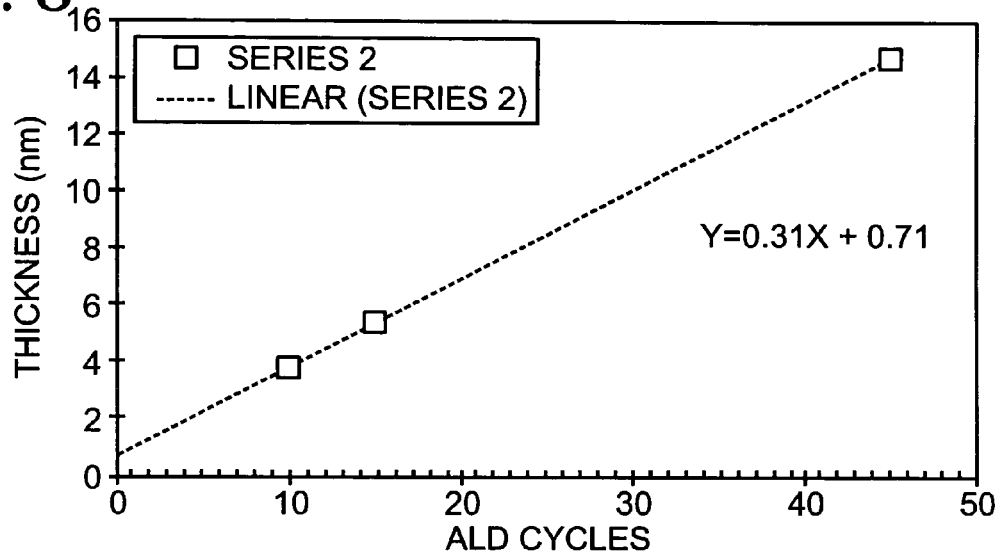
FIG. 8 depicts ALD cycles v. film thickness using the method of the invention.

Thickness was measured via spectroscopic ellipsometry. A plot of optical thickness at the center of the wafer vs. the number of deposition cycles is depicted in FIG. 8, and demonstrates that thickness is linearly dependent on the number of deposition cycles. Thickness variation was less than +/−5% over a 6" wafer. The fact that the linear fit in the plot below does not intersect the x-axis confirms ease of deposition on H-terminated silicon. From the slope of the curve, a deposition rate of 0.31 nm/cycle is extracted. This deposition rate range is approximately two to four times higher than that previously reported for either Hf(NO$_3$)$_4$/H$_2$O or HfCl$_4$/H$_2$O depositions. Based solely on Hf application, an approximate two times increase is expected. However, this rate is lower than the 0.7 nm/cycle that is observed for the dual precursor films that were annealed only after the deposition was complete. This suggests that the extra anneals, following N ALD cycles, serve to densify the film.

Films were deposited via 45 cycles, with and without temperature modulation. The modulated temperature samples were annealed at ~420° C. after each deposition cycle, while the sample without temperature modulation was annealed in-situ at ~420° C. only after all of the deposition cycles were complete. The as-deposited thickness was ~14.7 nm for the film deposited with modulated temperature annealing while the thickness was ~31.8 nm for the film deposited without. Further post-deposition annealing at temperatures up to 650° C. for 10 min of the film deposited with out temperature modulation resulted in a thickness of ~30.4 nm, a decrease of ~5%. Another film that was deposited using the modulated temperature anneal of the method of the invention and annealed for 20 min at 600° C. decreased in thickness by only ~8%. These results indicate that reasonable post deposition anneals are unable to achieve the same level of densification as anneals conducted after each ALD cycle.

Densification

Figure 9:
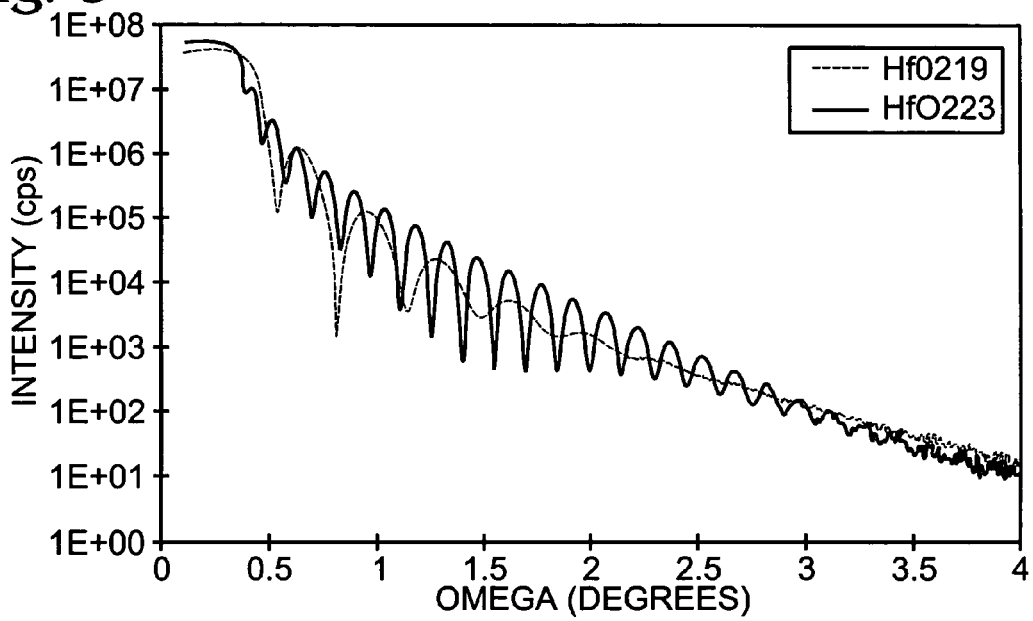
FIG. 9 depicts XRR spectra for a thin film formed according to the method of the invention.

Referring now to FIG. 9, SE measurements revealed that the films could be modeled as transparent, with n=2.05 at K=632.8 nm. This is a higher refractive index than the n=1.96 that was found for the HfO$_2$ films that were annealed only at the end of all of the deposition cycles. A higher refractive index indicates densification of the film. As a further indication of densification, XRR spectra are shown above at right. Modeling of the XRR data indicates that the density of the modulated temperature film is approximately 9.8 g/cm$^3$, about equal to the bulk value of 9.7 g/cm$^3$. The films that did not receive per cycle anneals were found to be ~8.2 g/cm$^3$, indicating an increase in density of ~20% in the modulated temperature samples. The increased density should translate to improved electrical characteristics as long as crystallization is avoided.

Improved Electrical Properties

Figure 10:
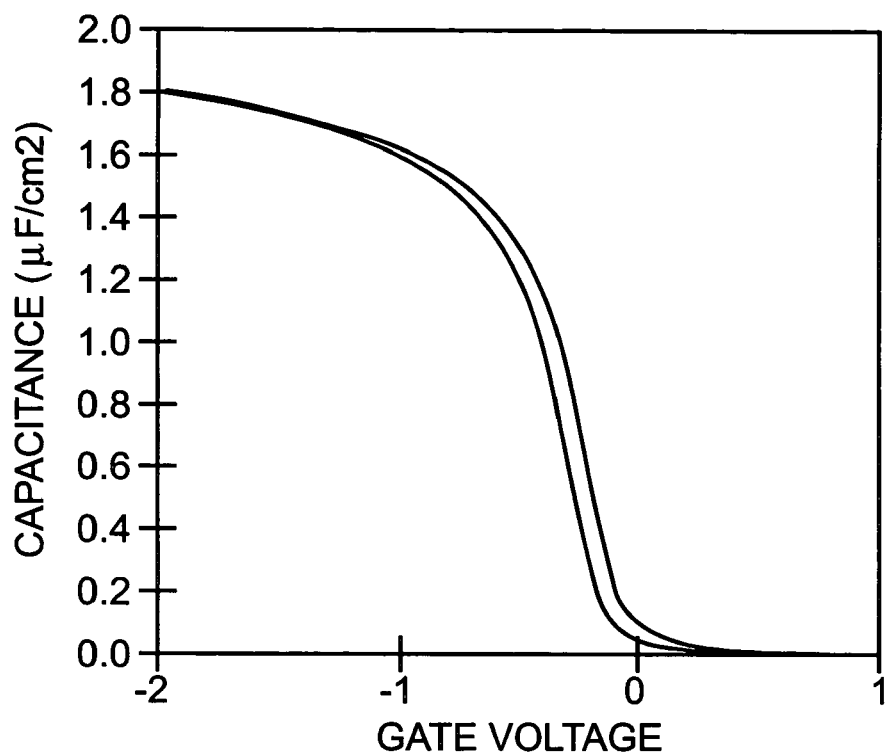
FIGS. 10 and 11 depict capacitance and current v. gate voltage for a thin film constructed according to the method of the invention, respectively.
Figure 11:
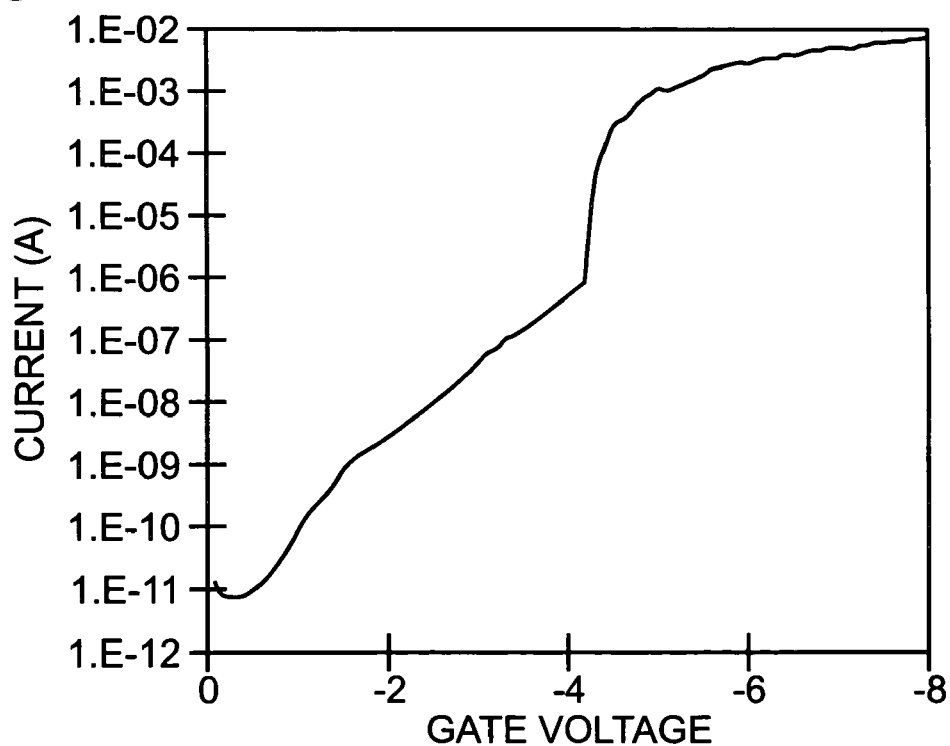

TiN gate capacitors were formed using a photolithographic process. TiN patterning was followed by a 30 min, 450° C. anneal in N$_2$/H$_2$. A sample capacitance vs. voltage curve is depicted in FIG. 10. Hysteresis is fairly low. A sample leakage current vs. gate voltage is depicted in FIG. 11. Hard breakdown occurs at approximately 4.2 V for a CET=1.9 nm film, corresponding to an effective BD field of ~22 MV/cm.

Figure 12:
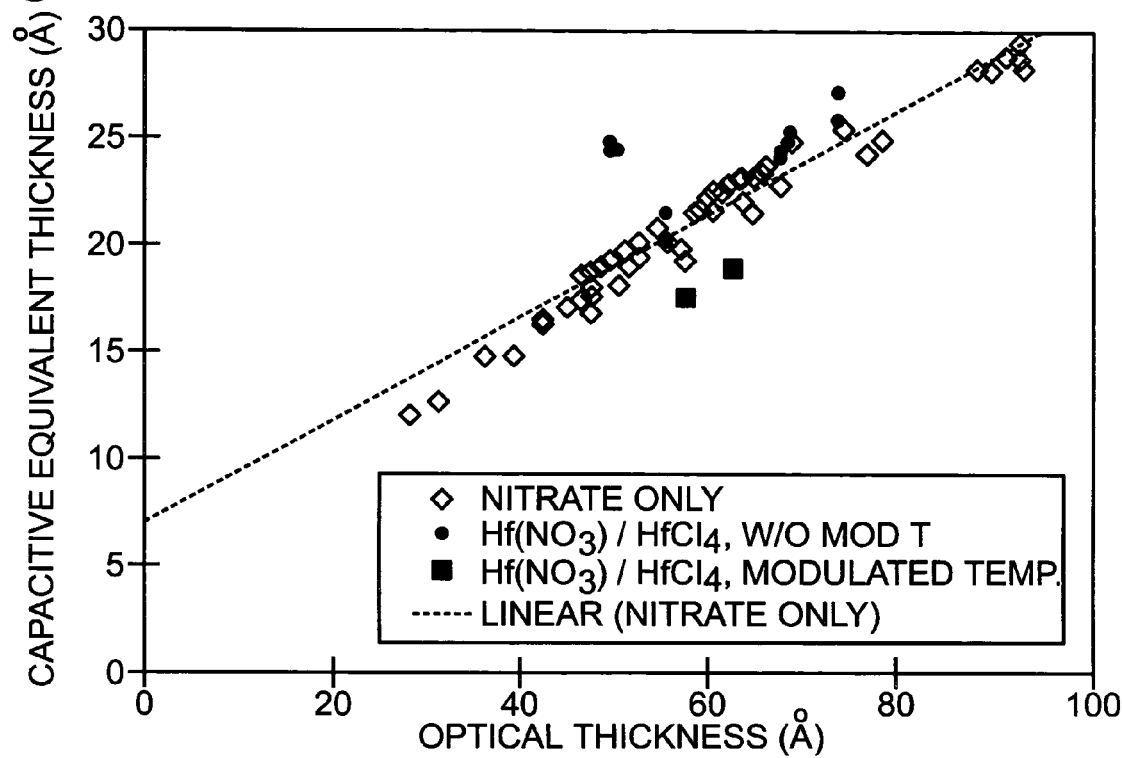
FIG. 12 depicts a capacitance v. voltage for a thin film constructed according to the method of the invention.
Figure 13:
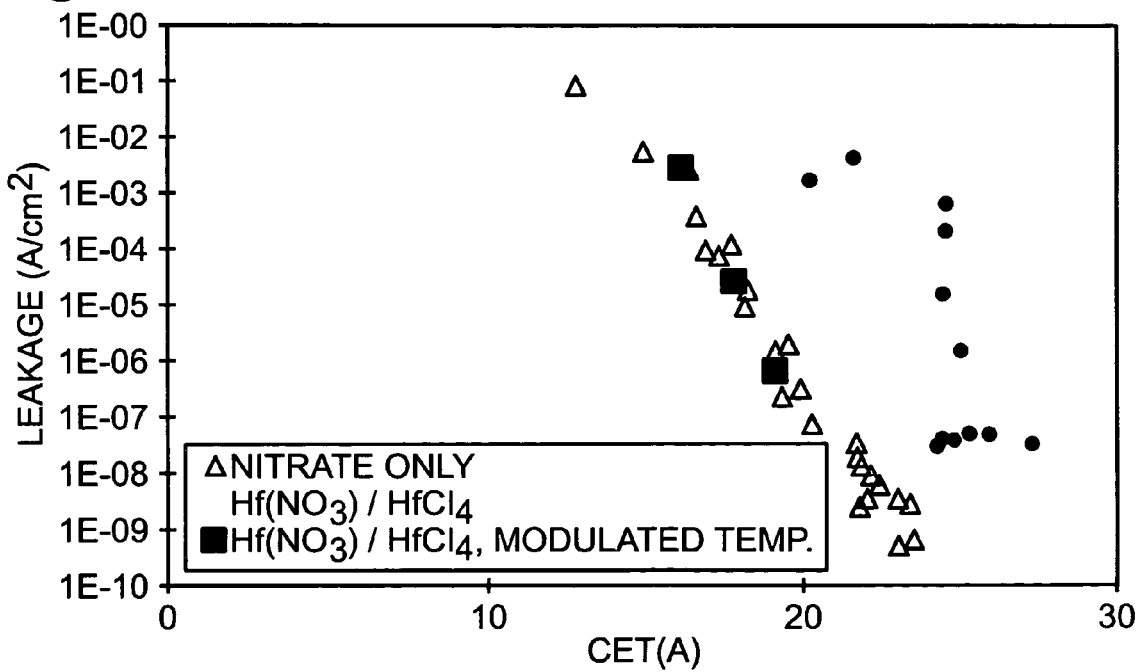
FIG. 13 depicts leakage v. CET for a thin film constructed according to the method of the invention.

FIG. 13 is a plot of leakage current vs. CET for modulated temperature films (squares), dual precursor film (circles), and, as a baseline, Hf(NO$_3$)$_4$/H$_2$O films (diamonds). It is seen that leakage of the modulated temperature films is as good as that for the baseline films. Leakage for the dual precursor films without the temperature modulation is much worse. FIG. 12 depicts a plot of CET vs. optical thickness for modulated temperature films (squares), dual precursor film (circles), and, as a baseline, Hf(NO$_3$)$_4$/H$_2$O films (diamonds). It can be seen that the modulated temperatures exhibit an approximately 20% improvement in k$_{eff}$. For a 5.7 nm film, with CET~1.8, k$_{eff}$~12.5, whereas for a nitrate-only film, the effective dielectric constant is closer to 10.5.

The "modulated temperature" ALD process should be applicable to any ALD precursor combination for any other metal oxide, such as ZrO$_2$, Gd$_2$O$_3$, La$_2$O$_3$, CeO$_2$, TiO$_2$, Y$_2$O$_3$, Ta$_2$O$_5$, Al$_2$O$_3$, HfAlO$_x$, ZrAlO$_x$, LaO$_x$, etc., or a combination thereof, wherein alternating layers of oxide are deposited from nitride-containing and a chloride-containing precursors.

Thus, a method for modulated temperature ALD has been disclosed. It will be appreciated that further variations and modifications thereof may be made within the scope of the invention as defined in the appended claims.

We claim:

1. A method of forming a layer of high-k dielectric gate oxide in an integrated circuit comprising:
   preparing a silicon substrate, including forming an H-terminated surface on the silicon substrate;
   forming a high-k dielectric layer by a sequence of ALD cycles and elevated temperature annealing including:
      depositing a first layer of metal ligand by an ALD cycle with a metal nitrate precursor to form a metal oxide layer; and
      depositing a second layer of metal ligand by ALD cycle with a non-oxygen containing metal chloride precursor to form a metal oxide layer;
      repeating said depositing a first layer of metal ligand and said depositing a second layer of metal ligand N times to form a layer of metal oxide having a near-critical thickness;
   annealing the substrate and the metal oxide layers in an elevated temperature annealing process every N ALD cycles;
      repeating the sequence of ALD cycles and elevated temperature annealing until a high-k dielectric metal oxide layer of desired thickness is formed;
      annealing the structure in a final annealing step; and
      completing the integrated circuit.

2. The method of claim 1 which includes selecting a metal oxide taken from the group of metal oxides consisting of $HfO_2$, $ZrO_2$, $Gd_2O_3$, $La_2O_3$, $CeO_2$, $TiO_2$, $Y_2O_3$, $Ta_2O_5$, $Al_2O_3$, $HfAlO_x$, $ZrAlO_x$, $LaO_x$, and combinations thereof, to be deposited on the silicon substrate.

3. The method of claim 1 wherein said depositing a first layer of metal ligand includes depositing an initial layer of metal oxide having a thickness of between less than a monolayer to about 2.5 nm, and wherein said depositing a second layer of metal ligand includes depositing a layer of metal oxide having a thickness of between less than a monolayer to about 2.5 nm.

4. The method of claim 1 wherein said annealing the substrate and the first and second metal oxide layers includes annealing at a temperature of between about 300° C. to 850° C. for between about one second to five minutes to remove excess ligands from a just-deposited layer before ligand buildup is too great for removal during a post-deposition anneal.

5. The method of claim 1 wherein said final annealing step includes annealing at a temperature of between about 400° C. to 1000° C. for between about one second to ten minutes.

6. The method of claim 1 wherein said depositing a first layer of metal ligand and said depositing a second layer of metal ligand includes depositing a layer using an ALD cycle having a pulse duration of between about 0.1 seconds to 100 seconds at a substrate temperature of between about 150° C. to 190° C.

7. The method of claim 1 wherein a near-critical thickness is that thickness where excess ligands may be efficiently removed before their buildup is so great that they can not be all removed by in the final annealing step.

8. A method of forming a layer of $HfO_2$ high-k dielectric gate oxide in an integrated circuit comprising:
   preparing a silicon substrate, including forming an H-terminated surface on the silicon substrate;
   forming a high-k dielectric layer by a sequence of ALD cycles including:
      depositing a first layer of $HfO_2$ using an ALD cycle with a $Hf(NO_3)_4$ precursor to form a metal oxide layer; and
      depositing a second layer of $HfO_2$ using an ALD cycle with a $HfCl_4$ precursor to form a metal oxide layer;
      wherein said depositing a first layer of metal ligand and said depositing a second layer of metal ligand includes depositing a layer using an ALD cycle having a pulse duration of between about 0.1 seconds to 100 seconds at a substrate temperature of between about 150° C. to 190° C.;
      repeating said depositing a first layer of metal ligand and said depositing a second layer of metal ligand N times to form a layer of metal oxide having a near-critical thickness, wherein a near-critical thickness is that thickness where excess ligands may be efficiently removed before their buildup is so great that they can not be all removed by in the final annealing step;
   annealing the substrate and the metal oxide layers in an elevated temperature annealing process every N ALD cycles at a temperature of between about 300° C. to 850° C. for between about one second to five minutes to remove excess ligands from a just-deposited layer before ligand buildup is too great for removal during a post-deposition anneal;
      repeating the sequence of ALD cycles and elevated temperature annealing until a high-k dielectric metal oxide layer of desired thickness is formed;
   annealing the structure having the $HfO_2$ layer of desired thickness thereon in a final annealing process a temperature of between about 400° C. to 1000° C. for between about one second to ten minutes; and
   completing the integrated circuit.

9. The method of claim 8 which includes selecting a metal oxide taken from the group of metal oxides consisting of $HfO_2$, $ZrO_2$, $Gd_2O_3$, $La_2O_3$, $CeO_2$, $TiO_2$, $Y_2O_3$, $Ta_2O_5$, $Al_2O_3$, $HfAlO_x$, $ZrAlO_x$, $LaO_x$, and combinations thereof, to be deposited on the silicon substrate.

10. The method of claim 8 wherein said depositing a first layer of metal ligand includes depositing an initial layer of metal oxide having a thickness of between less than a monolayer to about 2.5 nm, and wherein said depositing a second layer of metal ligand includes depositing a layer of metal oxide having a thickness of between less than a monolayer to about 2.5 nm.

* * * * *